US007158581B2

(12) United States Patent
Weiss et al.

(10) Patent No.: US 7,158,581 B2
(45) Date of Patent: Jan. 2, 2007

(54) METHOD OF DETERMINING PARAMETERS OF AN N-GATE

(75) Inventors: Martin Weiss, Holzkirchen (DE); Kurt Schmidt, Grafing (DE); Roland Minihold, München (DE); Albert Winter, Forstinning (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 802 days.

(21) Appl. No.: 10/169,849

(22) PCT Filed: Dec. 14, 2000

(86) PCT No.: PCT/EP00/12750

§ 371 (c)(1), (2), (4) Date: Jul. 10, 2002

(87) PCT Pub. No.: WO01/69778

PCT Pub. Date: Sep. 20, 2001

(65) Prior Publication Data

US 2002/0191711 A1 Dec. 19, 2002

(30) Foreign Application Priority Data

Mar. 16, 2000 (DE) ................................ 100 12 829
May 10, 2000 (DE) ................................ 100 22 853

(51) Int. Cl.
*H04L 25/49* (2006.01)

(52) U.S. Cl. ...................................................... 375/296
(58) Field of Classification Search ................ 375/295, 375/296, 130, 140, 146, 219
See application file for complete search history.

(56) References Cited

U.S. PATENT DOCUMENTS 4,710,932 A 12/1987 Hiroshi
5,168,459 A 12/1992 Hiller
6,133,789 A * 10/2000 Braithwaite ................. 330/149
6,674,808 B1 * 1/2004 Griph et al. ................ 375/285
6,798,843 B1 * 9/2004 Wright et al. ............... 375/296

FOREIGN PATENT DOCUMENTS

DE 198 13 703 A1 2/1999

* cited by examiner

*Primary Examiner*—Kevin Burd
(74) *Attorney, Agent, or Firm*—Ditthavong & Mori, P.C.

(57) ABSTRACT

A method for determining the parameters and characteristics of an n-port network such as an amplifier is described. The parameters are determined by applying an input signal train or sequence with different amplitudes and measuring an output signal train, taking into account a temporal displacement that the output signal train has in relation to the input signal train. The temporal displacement is determined by a cross-correlation of the output signal train with the input signal train.

20 Claims, 4 Drawing Sheets

I/Q Baseband Data (analog)
Vector Signal Generator (SMIQ) 5
IQ-Modulation Generator (AMIQ) 3
RF-Signal
RF-Step Attenuator (RSP) 6
Trigger
SPDT Switch 7
0dBm
Control
Data
DUT (e.g.Power Amplifier) 8
0dBm
30dBm
Computer 4
RF-Step Attenuator (RSG) 9
0dBm
SPDT Switch 10
Control
Data
RF-Step Attenuator (RSP) 11
RF-Signal
Signal Analyzer (FSIQ) 12
IQ-Mixer (digital) 13
IQ-Baseband-Data (digital,14Bit)
FSIQB70 14

METHOD OF DETERMINING PARAMETERS OF AN N-GATE

FIELD OF THE INVENTION

The invention relates to a method of determining parameters of an n-port network and particularly a method of determining linear and non-linear characteristics of a high frequency power amplifier.

BACKGROUND OF THE INVENTION

In the case of high-frequency amplifiers particularly for transmitting a wideband signal such as a CDMA signal, there are special requirements that the gain characteristic and phase-response characteristic have to meet but that cannot easily be met by the active components. One possible way of linearizing these characteristics is to apply to the input signal of the amplifier pre-distortion that is the inverse of the distortion the signal will be subject to in the amplifier. To enable pre-distortion of this kind to be performed, it is necessary to determine the characteristics of the amplifier and the inverse characteristics needed for the predistortion. However, the method according to the invention is suitable not only for determining characteristics of a high-frequency amplifier, that can be looked upon as a two-port network, but also in general for determining parameters of an n-port network, such as a mixer for example that can be looked upon as a three-port network.

Published German patent application no. DE 198 13 703 A1 discloses a method of determining the characteristics of a non-linear power amplifier and for automatically tuning a pre-distorter inserted upstream of the power amplifier. In the method that is known from this printed publication, the input signal to the amplifier is split into an envelope curve and a reference carrier by means of a synchronous demodulator. The reference carrier is fed to the synchronous demodulator provided at the output of the power amplifier to allow phase-coherent demodulation into the in-phase component and quadrature component of the output signal to be performed with the reference carrier. A suitable indicator or display means is provided in this case to allow the amplitude characteristic and phase characteristic to be shown. At the same time, the characteristic curve that is obtained in this way is fed to a digital signal processor that so regulates the predistortion that as linear as possible an amplitude characteristic and as constant as possible a phase characteristic are produced. However, it is a prerequisite of this method, that is carried out while the amplifier is operating, that the input signal to the amplifier and the output signal are correlated with one another. If the amplifier is measured not in an operational situation but on a test rig with for example a one-channel measuring device and without the complicated and costly synchronous demodulation described in DE 198 13 703 A1, then there is a measurement problem in that, due to different trigger times for example, there is no precisely defined temporal correlation between the amplifier's input and output signals.

A need exists therefore to specify a method of determining parameters of an n-port network in which the measurement of an output signal train can be performed without referencing to the timing of an input signal train and it is in particular possible for complicated and costly synchronous demodulators for generating a reference carrier to be dispensed with.

SUMMARY OF THE INVENTION

This and other needs are addressed by the present invention based on the finding that the missing referencing between the timings of the output signal and the input signal can be produced by cross-correlating the output signal with the input signal. The input signal and output signal at the n-port network can be plotted by independent series of measurements lacking any referencing to each other's timings, using for example a one-channel measuring device, and the missing timing referencing is not produced in accordance with the invention by the cross-correlation until the evaluation stage. The simultaneous measurement of the input and output signals and the synchronous demodulation of the output signal with a reference carrier obtained from the input signal that are necessary in the prior art are not needed, and it is thus possible for the measuring process to be considerably simplified.

The cross-correlation to determine the temporal displacement between the input signal and the output signal is preferably performed not by convolution in the time domain but by multiplication in the frequency domain. For this purpose, the Fourier transform of the input signal and the Fourier transform of the output signal are determined and either the Fourier transform of the input signal is multiplied by the conjugate complexes of the output signal or the output signal is multiplied by the conjugate complex of the input signal, to obtain a so-called timing term. The timing term comprises a quantitative component that is dependent not on the temporal displacement but only on frequency and a phase component that is dependent on frequency and on the temporal displacement that is being looked for. The temporal displacement can be found from this phase component by regression. The output signal can then be shifted in time by the temporal displacement that is found, to produce a correlation between the input signal and the output signal. This can also be done in the frequency domain before the output signal is subjected to Fourier back-transformation.

By allowing for the temporal displacement that has been found in this way, it is for example possible to determine the AM/AM characteristic, or in other words the output power of the amplifier as a function of the input power, and the PM/AM characteristic, or in other words the phase difference between the output signal and the input signal as a function of the input power. The corresponding pre-distortion characteristics can be obtained by mirror-imaging about the respective ideal characteristics, i.e. about a straight line of constant gradient for the AM/AM characteristic and about the x-axis for the PM/AM characteristic.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

An embodiment of the invention will be explained in detail below by reference to the drawings. In the drawings.

DESCRIPTION OF THE PREFERRED EMBODIMENT

Figure 1:
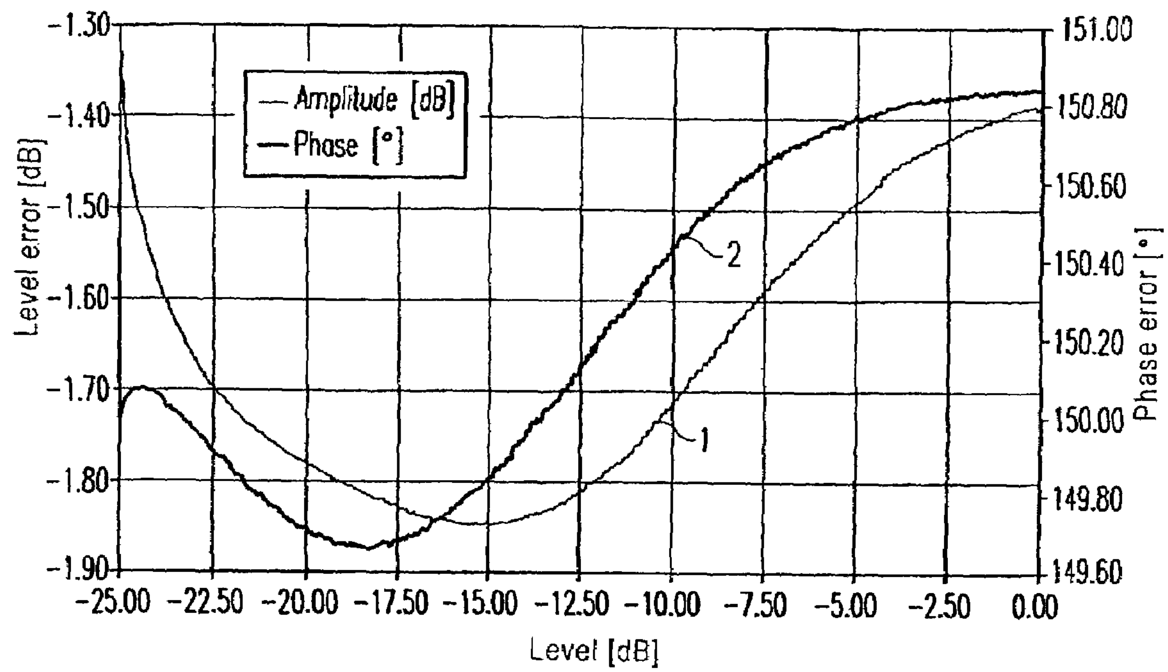
FIG. 1 shows the level error and the phase error of a high-frequency amplifier uncorrected by predistortion.

FIG. 1 shows the level error and phase error of an actual high-frequency amplifier. What is termed the level error is a characteristic that represents the deviation of the output power given by the actual amplifier from the output power that an ideal amplifier would be expected to-give, as a function of the input power. The phase error too, that is to say the deviation of the phase of the input signal from the phase of the output signal, is not in any way zero or at least constant. Pre-distortion is therefore required to enable the amplifier to operate satisfactorily. For this, the so-called AM/AM characteristic and AM/PM characteristic have to be determined. What is meant by the AM/AM characteristic is the output amplitude or power as a function of the input amplitude or power. What is meant by the AM/PM characteristic is the difference between the phase of the output signal and the phase of the input signal as a function of the amplitude or power of the input signal.

Figure 2:
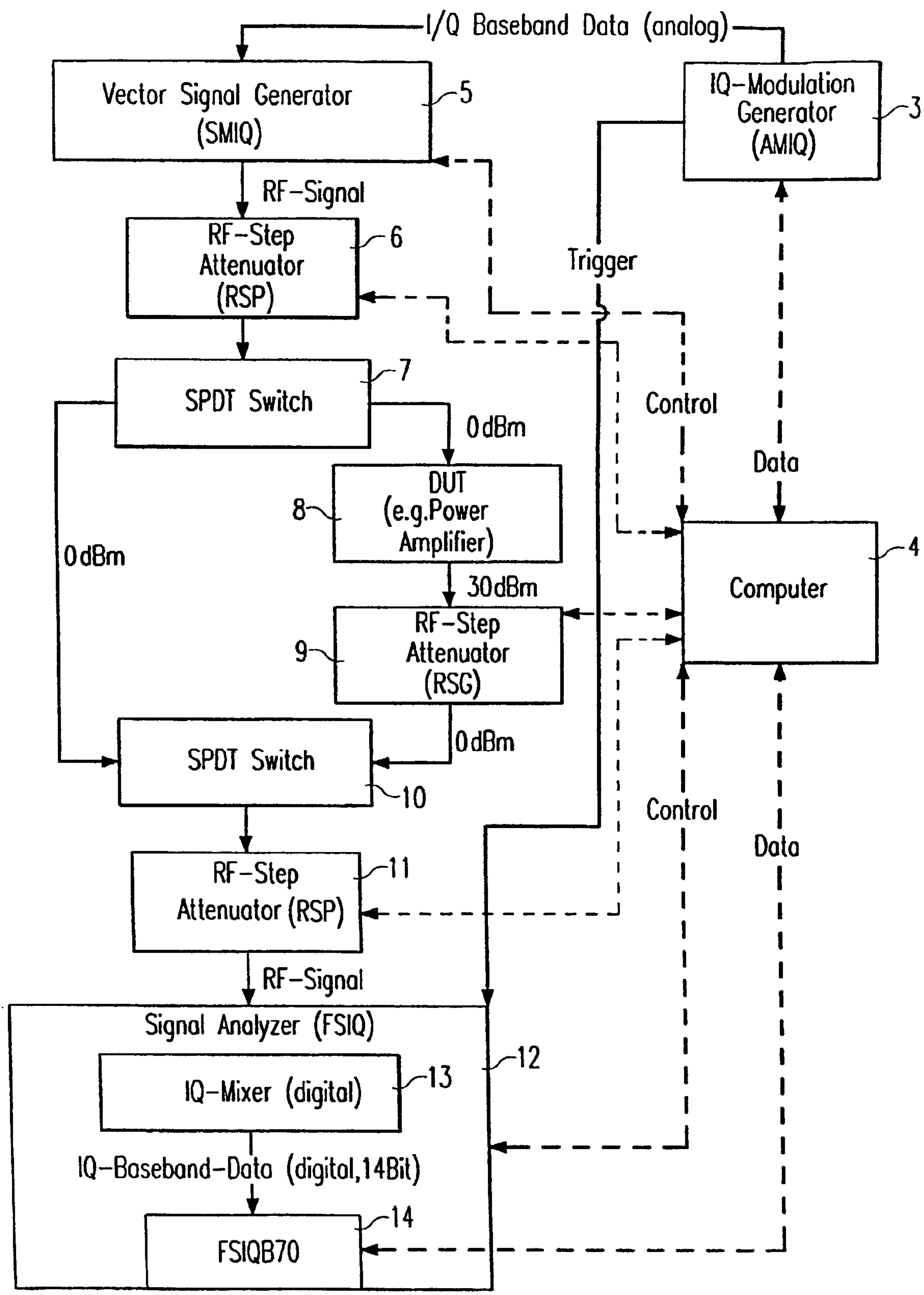
FIG. 2 is a block circuit diagram of a measuring arrangement for carrying out the method according ding to the invention.

FIG. 2 shows a measuring arrangement for determining these characteristics. An IQ modulation generator 3 is supplied with the modulation data by a controlling computer 4 and generates an analog I/Q baseband signal. This signal is fed to a vector signal generator 5 that generates a wideband high-frequency signal as a function of the modulation data. Hence, in contrast to conventional network analysis, the amplifier is driven by a realistic input signal reflecting the purpose for which it will be used, such as a CDMA signal to the IS95 standard for example. This wideband high-frequency signal is fed to the n-port network on which measurements are being made, which in the embodiment shown here is a high-frequency amplifier 8, via an adjustable attenuator 6 and a first switch 7. The output power from the n-port network on which measurements are being made, i.e. the high-frequency amplifier 8, is fed via an adjustable attenuator 9 to a second switch 10, a further adjustable attenuator 11 and finally a signal analyzer 12. In the signal analyzer 12 is an IQ mixer 13 that mixes the input signal back into the IQ baseband, where it can be detected by an IQ demodulator 14. Having been measured in this way the output signal is fed to the controlling computer 4 for evaluation. All the components described above are connected via a control bus 15 to the controlling computer 4. The attenuators 9 and 10 provided at the output of the amplifier 8, or in general terms the n-port network, on which measurements are being made make it possible for an input level of approximately the same order of magnitude to be fed to the signal analyzer 12 irrespective of the drive to the n-port network on which measurements are being made, thus avoiding any changeovers between ranges of measurement and the inaccuracies of measurement these would involve.

If switches 7 and 10 make a direct connection between vector signal generator 5 and signal analyzer 12, then the input signal train whose amplitude changes in steps can be measured as a series of measurements made up of discreet measured values. For a further series of measurements the two switches 7 and 10 are changed over such that the signal passes through the amplifier on which measurements are to be made, thus enabling the signal analyzer 12 to measure the output signal train from the amplifier 8 as a series of measurements made up of discreet measured values when the previously measured input signal train is applied to the input of amplifier 8. When this is the case, signal analyzer 12 operates as a one-channel measuring device. However, basically it is also possible for a two-channel signal analyzer 12 having two input channels to be used, the input signal train to and output signal train from amplifier 8 then being measured simultaneously. If the input signal train is generated with sufficient accuracy by vector signal generator then any measurement thereof can, if required, be dispensed with.

In the method of measurement described above there is no fixed timing referencing between the input signal train to and the output signal train from the amplifier 8 on which measurements are being made. one reason for the loss of this timing referencing may for example be that when a sequence of measurements is starting the IQ modulation generator 3 gives a trigger pulse that starts the signal analyzer 12. However, signal analyzer 12 samples the input signal at an internal clock frequency that is not correlated with the trigger pulse from IQ modulation generator 3. The random timing referencing that the trigger pulse from IQ modulation 15 generator 3 has with the internal clock signal of signal analyzer 12 produces for the two separate series of measurements made on the input and output signals a random temporal displacement $\tau$ between the two series of measurements.

Figure 3:
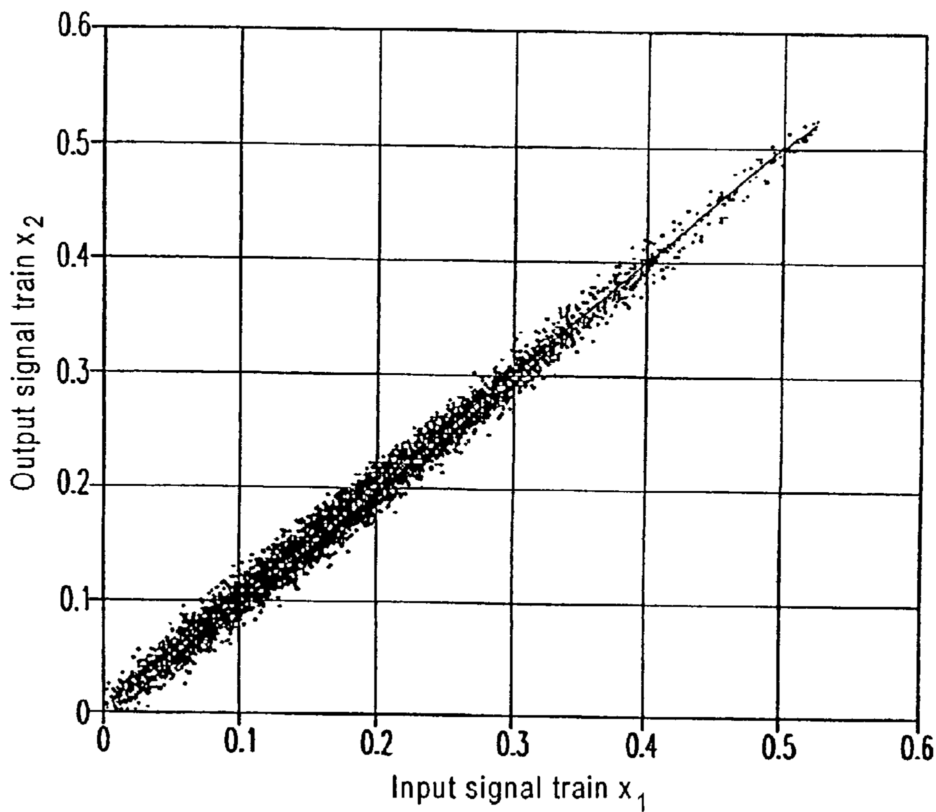
FIG. 3 shows the AM/AM characteristic of an amplifier where no allowance is made for the temporal displacement between the input signal and output signal.

FIG. 3 shows the output signal train from amplifier 8, as measured by the measuring arrangement described with reference to FIG. 2, plotted against the input signal train that was also measured. Because of the indeterminate timing referencing that the two series of measurements have, the characteristic obtained is imprecise and blurred and will not allow any further evaluation to be performed.

It is at this point that the present invention comes into play and proposes that the missing timing referencing between the output signal train and input signal train is first produced before the characteristic is determined. In accordance with the invention, it is proposed that the temporal displacement $\tau$ be found by cross-correlating the output signal train with the input signal train. In a preferred procedure according to the invention, this cross-correlation is performed not by convolution in the temporal domain but by multiplication in the frequency domain. In detail, the procedure is as follows:

An input signal train $x_1(t)$ made up of discreet data symbols is first recorded by moving switches 7 and 10 to positions 10 such that the amplifier 8 on which measurements are to be made, or in general terms the n-port network on which measurements are to be made, is bypassed. An output signal train $x_2(t)$ is then recorded by moving switches 7 and 10 to positions such that the signal is conducted through the amplifier 8 or n-port network on which measurements are to be made. The output signal train $x_2(t)$ differs from the input signal train $x_1(t)$ not only in distortion but also by a temporal displacement $\tau$.

$$X_2(t)=x_1(t-\tau) \tag{1}$$

The Fourier transform $x_1(f)$ of the input signal train $x_1(t)$ and the Fourier transform $X_2(f)$ of the output signal train $x_2(t-\tau)$ are then calculated. The equation that applies to the Fourier transforms in this case is:

$$X_2(f)=X_1(f)\cdot e^{i2\pi f\tau} \tag{2}$$

If the conjugate complex $X_2^*(f)$ is calculated for $X_2(f)$ and the Fourier transform $X_1(f)$ is multiplied by the conjugate complex $X_2^*(f)$ of the Fourier transform of the output signal train, then what is obtained is a so-called timing term X:

$$X=X_1(f)\cdot X_2^*(f)=X_1(f)\cdot X_1^*(f)\cdot e^{i2\pi f\tau} \tag{3}$$

Alternatively, the conjugate complex $X_1^*(f)$ of the input signal train may also be multiplied by the Fourier transform $X_2(f)$ of the output signal train. What is then obtained as the timing term X is the following:

$$X=X_2(f)\cdot X_1^*(f)=X_2(f)\cdot X_2^*(f)\cdot e^{i2\pi f\tau} \tag{4}$$

The correspondences $X_1\cdot X_1^*=|x_1|^2$ and $X_2\cdot X_2^*=|x_2|^2$ then give:

$$X=X_1(f)\cdot X_2^*(f)\cdot X_1^*(f)=|X_1(f)|^2\cdot e^{i2\pi f\tau} \tag{5}$$

and $$X=X_2(f)\cdot X_1^*(f)=|X_2(f)|^2\cdot e^{i2\pi f\tau} \tag{6}$$

respectively.

By extracting the phase component arg(X) from the complex timing term X, what are obtained are:

$$arg(X)=2\pi f\tau \tag{7}$$

and $$arg(X)=-2\pi f\tau \tag{8}$$

Whereas the distortion is expressed in the amplitude component of timing term X, the phase component expresses the temporal displacement $\tau$.

Because frequency f is known as a moving variable or index of the discreet reference points, it is possible for the temporal displacement $\tau$ between the output signal train $x_2$ and the input signal train $x_1$ to be determined.

Figure 5:
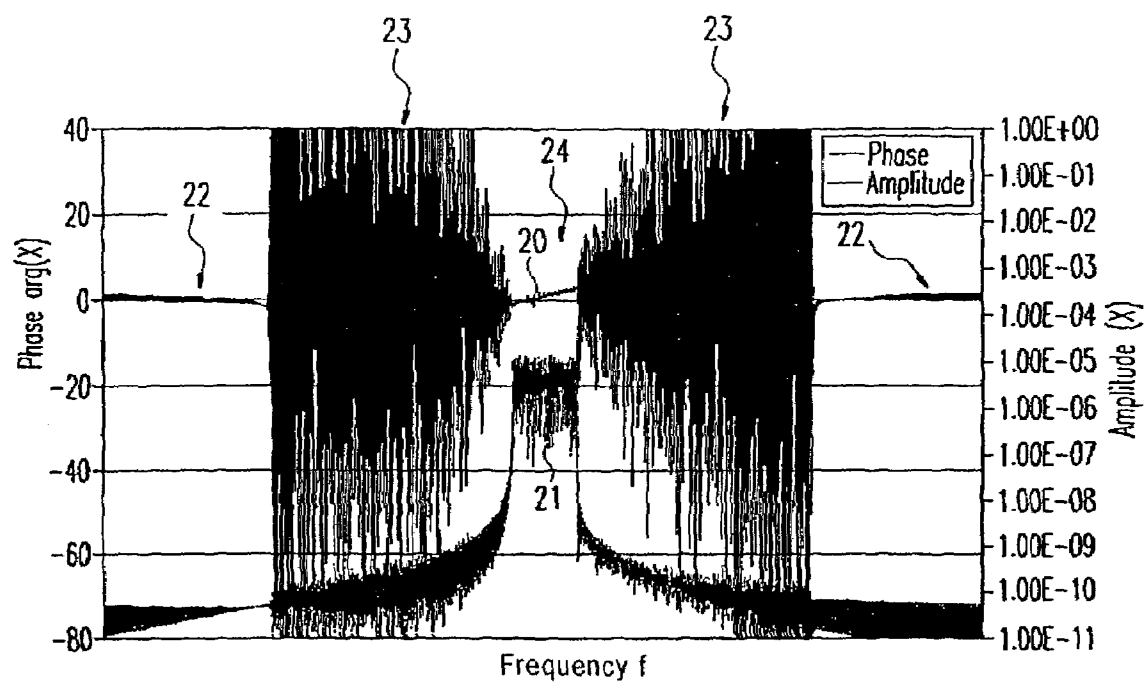
FIG. 5 shows the phase component and amplitude component of a timing term obtained from the Fourier transform of the input signal and the Fourier transform of the output signal.

FIG. 5 shows the phase component 20 and amplitude component 21 of timing term X as a function of frequency f. There are three regions that can be distinguished in this case. An outer region 22 is outside the bandwidth of the measuring arrangement. A center region 23 is within the bandwidth of the measuring arrangement but there is as yet no correlation between the input signal train $x_1$ and the output signal train $x_2$ because at this point the measurement is outside the channel bandwidth of the modulation signal. Timing term X is therefore noisy in respect of phase. Region 24 is within the transmission channel, i.e. within the channel bandwidth of the modulation signal. At this point there is a clear correlation between the measured output signal train x2 and the measured input signal train $x_1$. It can be seen that in the embodiment shown the phase component arg(X) of timing term X rises linearly with frequency. This can also be expected because, given a finite electrical or mechanical length for amplifier 8, or in general terms for the n-port network on which measurements are being made, the phase-shift between the input and output signals is a linear function of frequency. This being the case, the temporal displacement $\tau$ required can be found by linear regression by plotting a straight line of constant gradient in the correlated region 24 by regression, the gradient being $2\pi\tau$.

It is also conceivable that the n-port network on which measurements are being made may contain elements that cause a frequency-dependent temporal displacement $\tau(f)$ between the output and input signals. The functional relationship between the phase component arg(X) of timing term (X) and frequency (f) within the correlated region (24) will then be not a straight line but a higher-order function that can also be found by appropriate regression.

It is also found that, in the correlated region 24, the fluctuation of the phase component arg(X) is greater the smaller is the associated amplitude of timing term (X). Therefore, in a refinement of the invention, the reference points found for the phase component arg(X) of timing term X can be introduced into the regression with a weighting that depends on the amplitude of timing term X.

The temporal displacement $\tau$ having been found, the output signal train $x_2$ can be shifted in time by this temporal displacement t to produce a temporal correlation between the input signal $x_1$ and the output signal $x_2$. This shift in time is preferably made not by convolution in the time domain but by multiplication in the frequency domain. For this purpose the term $i2\pi f\tau$ is added to the phase of the Fourier transform of the output signal train $X_2(f)$. Having been modified in this way, the Fourier transform of the output signal train is then Fourier back-transformed so that the shifted output signal train $x'_2(t)$ is in the time domain. It must be stressed in this case that a step that appears obvious at first sight, namely simply shifting the sampled reference points in the output signal train $X_2$ by multiples of the sampling period, will not allow the aim to be achieved, because the shift according to the invention has to be made by fractions of the sampling period, which is only possible in the time domain by interpolation.

Figure 4:
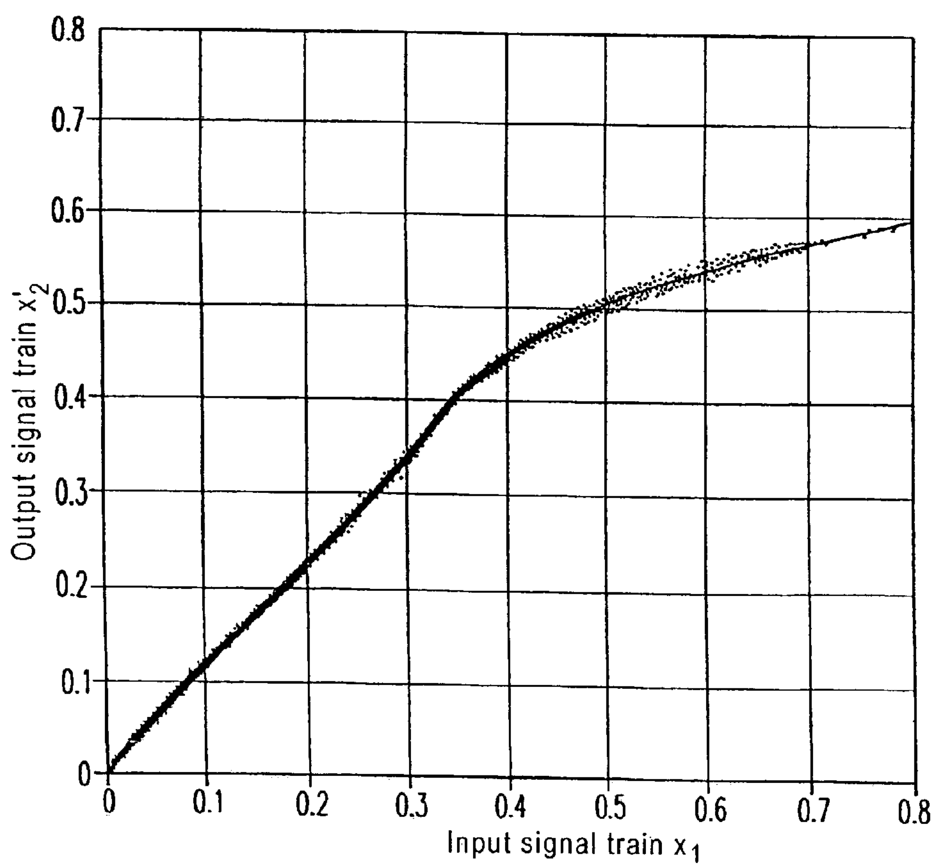
FIG. 4 shows the AM/AM characteristic of an amplifier where allowance is made for the temporal displacement between the input signal and output signal.

FIG. 4 shows the output signal train $x_2$ shifted by the temporal displacement $\tau$, as a function of the input signal train $x_1$. As can be seen from a comparison with FIG. 3, the allowance made in accordance with the invention for the temporal displacement $\tau$ gives a considerably better correlation between the input signal train $x_1$ and the output signal train $x_2$, thus enabling the relation between input signal train $x_1$ and output signal train $x_2$ to be used to determine characteristics or other parameters.

Figure 6:
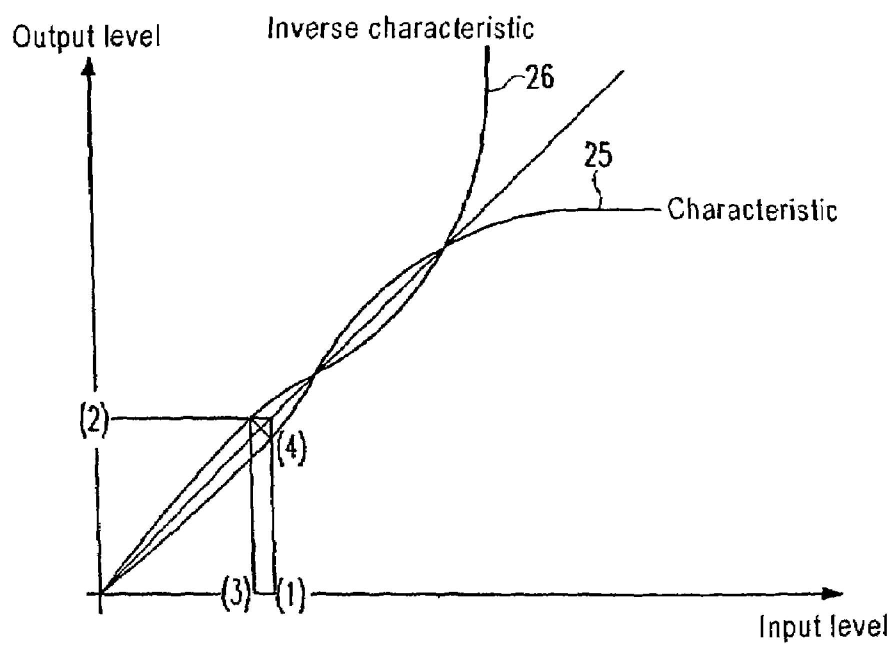
FIG. 6 shows an example of an AM/AM characteristic obtained by the method according to the invention and a pre-distortion AM/AM characteristic that is inverse thereto.

Once such characteristic is the so-called AM/AM characteristic, or in other words the level of the output signal as a function of the input signal (either in respect of amplitude or in respect of power, that can be obtained by squaring amplitude). This AM/AM characteristic can be found by regression from the relation shown in FIG. 4 between the input signal train $x_1$ and the temporally shifted output signal train $X'_2$ by laying a finite-order polynomial through the measured points such that the sum of the squares of the deviations represented by the errors is minimized. Such methods are known and will therefore not be described in detail here. The AM/AM characteristic 25 obtained by regression is shown in FIG. 4 and FIG. 6.

To correct for this non-linear AM/AM characteristic, the high-frequency amplifier 8 (or in general terms the n-port network) must have inserted upstream of it a pre-distorter that has an inverse pre-distortion AM/AM characteristic. To obtain the appropriate pre-distortion AM/AM characteristic, 30 the AM/AM characteristic measured has to be mirror-imaged about the ideal characteristic of the amplifier or n-port network. If the input level and output level are standardized to the maximum input level that occurs and the maximum output level that occurs, then this ideal characteristic is the line that bisects the angle between the x axis and y axis in FIG. 6. The inverse pre-distortion AM/AM characteristic 26 is also shown in FIG. 6.

Figure 7:
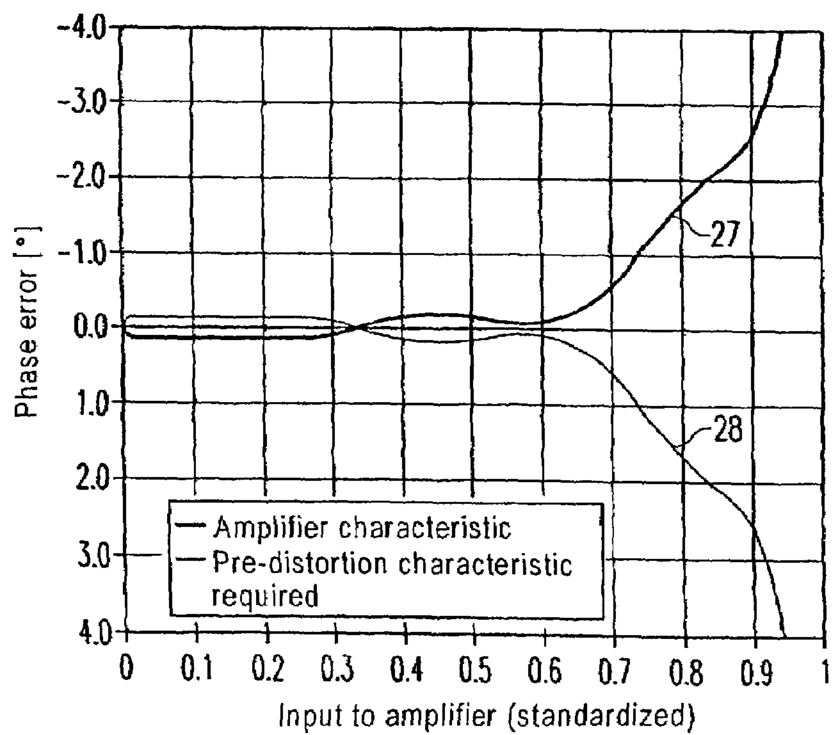
FIG. 7 shows an example of an AM/PM characteristic obtained by the method according to the invention and its associated pre-distortion AM/PM characteristic.

To correct for the phase error of amplifier 8 or in general terms of the n-port network, a similar procedure is adopted. A so-called AM/PM characteristic is first found by plotting the phase difference between the output signal train $x_2$ and the input signal train $x_1$ as a function of the input signal train $x_1$ and by regression with a finite-order polynomial assigning a functional relationship to by minimizing the sum of the squares of the errors. FIG. 7 shows such a PM/AM characteristic 27. It can be seen that the phase errors increase as the input level goes up. The ideal AM/PM characteristic is the x axis (no deviation by the phase of the output signal from the phase of the input signal at any input level). The pre-distortion AM/PM characteristic is therefore obtained by mirror-imaging the AM/PM 20 characteristic about the x axis. The pre-distortion AM/PM characteristic that is found in this way is also shown in FIG. 7. To correct for the phase error of amplifier 8 or the n-port network, the latter must have inserted upstream of it a pre-distorter that has the pre-distortion AM/PM 25 characteristic 28.

The invention is not limited to the embodiment shown and is suitable generally for determining parameters of an n-port network, including for example a mixer (a three-port 30 network). The input signal train $x_1$ and output signal train $x_2$ can also be determined simultaneously with a two-channel measuring device. Instead of regression with a finite-order polynomial it is also possible for use to be made of a lookup table, spline interpolation or some other known method. Unlike conventional network analysis, the method according to the invention allows the amplifier or n-port network to be driven by a realistic modulation, such for example as an operating signal such as a modulated CDMA signal to the $IS_{95}$ standard. By the inverse pre-distortion of the driver signal, a crucial improvement can be made both in the signal properties (e.g. scatter into neighboring channels) of the item being measured and in the quality of modulation of its output signal.

What is claimed is:

1. A method of determining parameters of an n-port network, comprising:

applying at least one modulated input signal train $x_1(t)$ of differing amplitudes to the n-port network;

measuring at least one output signal train $x_2(t+\tau)$ from the n-port network based on an allowance for a temporal displacement $\tau$ that the output signal train $x_2(t+\tau)$ has in relation to the input signal train $x_1(t)$; and determining the temporal displacement $\tau$ by cross-correlating the output signal train $x_2(t+\tau)$ with the input signal train $x_1(t)$, wherein the determining step includes, determining a Fourier transform $X_1(f)$ of the input signal train $x_1(t)$, determining a Fourier transform $X_2(f)$ of the output signal train $x_2(t+\tau)$, and calculating a conjugate complex $X^*_2(f)$ or $X^*_1(f)$ of the Fourier transform $X_2(f)$ of the output signal train or the Fourier transform $X_1(f)$ of the input signal train, where f is frequency.

2. A method according to claim 1, wherein determining the temporal displacement $\tau$ further includes: calculating a complex timing term $X=X_1(f)\cdot X_2{}^*(f)=X_2(f)\cdot X_1{}^*(f)\cdot e^{i2\pi f\tau}$ or $X=X_2(f)\cdot X_1{}^*(f)=X_2(f)\cdot X_2{}^*(f)\cdot e^{-i2\pi f\tau}$ by multiplying the Fourier transform $X_1(f)$ of the input signal train by the conjugate complex $X^*_2(f)$ of the Fourier transform of the output signal train or the Fourier transform $X_2(f)$ of the output signal train by the conjugate complex $X^*_1(f)$ of the Fourier transform of the input signal train, extracting the phase component $\arg(X)=2\pi f\tau$ of the complex timing term X, and finding the temporal displacement $\tau$ from the phase component $\arg(X)$ of the complex timing term X by regression.

3. A method according to claim 2, wherein the regression of the phase component $\arg(X)$ of the timing term X takes place in the frequency domain.

4. A method according to claim 2, wherein the output signal train $x_2(t+\tau)$ is shifted in time by the temporal displacement $\tau$ found to generate a shifted output signal train $x'_2(t)$.

5. A method according to claim 4, wherein the shift in time is made by:

adding the term $i2\pi f\tau$ to the phase of the Fourier transform of the output signal train $X_2(f)$, and carrying out a Fourier back-transformation of the output signal train.

6. A method according to claim 4, wherein an AM/AM characteristic of the n-port network is found by relating the output signal train $x_2'(t)$ that has been shifted in time by the temporal displacement $\tau$ found to the input signal train $x_1(t)$, and finding a functional relationship by regression.

7. A method according to claim 4, wherein an PM/AM characteristic of the n-port network is found by relating the difference between the phase of the output signal train $x_2'(t)$ that has been shifted in time by the temporal displacement $\tau$ found and the phase of the input signal train $x_1'(t)$ to the input signal train $x_1'(t)$, and finding a functional relationship by regression.

8. A method according to claim 6, wherein the regression is performed by polynomial regression.

9. A method according to claim 6, wherein a pre-distortion AM/AM characteristic and/or a predistortion PM/AM characteristic is found by mirror-imaging the AM/AM characteristic and/or the PM/AM characteristic about the respective ideal characteristic.

10. A method according to claim 1, wherein the input signal train $x_1(t)$ and the output signal train $x_2(t+\tau)$ are measured in temporal succession by a one-channel measuring device.

11. A method according to claim 1, wherein an input signal train $x_1(t)$, having a wideband spectrum, is a multi-carrier signal including a digitally modulated CDMA signal, a DAB signal or a DVB signal.

12. An apparatus for determining parameters of an n-port network, comprising:

means for applying at least one modulated input signal train $x_1(t)$ of differing amplitudes to the n-port network;

means for measuring at least one output signal train $x_2(t+\tau)$ from the n-port network based on an allowance for a temporal displacement $\tau$ that the output signal train $X_2(t+\tau)$ has in relation to the input signal train $x_1(t)$; and means for determining the temporal displacement $\tau$ by cross-correlating the output signal train $x_2(t+\tau)$ with the input signal train $x_1(t)$, wherein the determining means includes, means for determining a Fourier transform $X_1(f)$ of the input signal train $x_1(t)$, means for determining a Fourier transform $X_2(f)$ of the output signal train $x_2(t+\tau)$, and means for calculating a conjugate complex $X^*_2(f)$ or $X^*_1(f)$ of the Fourier transform $X_2(f)$ of the output signal train or the Fourier transform $X_2(f)$ of the input signal train, where f is frequency.

13. An apparatus according to claim 12, wherein the determining means further includes:

means for calculating a complex timing term $X=X_1(f)\cdot X_2^*(f)=X_2(f)\cdot X_1^*(f)\cdot e^{i2\pi f\tau}$ or $X=X_2(f)\cdot X_1^*(f)=X_2(f)X_2^*(f)\cdot e^{i2\pi f\tau}$ by multiplying the Fourier transform $X_1(f)$ of the input signal train by the conjugate complex $X^*_2(f)$ of the Fourier transform of the output signal train or the Fourier transform $X_2(f)$ of the output signal train by the conjugate complex $X^*_1(f)$ of the Fourier transform of the input signal train, means for extracting the phase component $\arg(X)=2\pi f\tau$ of the complex timing term X, and means for finding the temporal displacement $\tau$ from the phase component arg(X) of the complex timing term X by regression.

14. An apparatus according to claim 13, wherein the regression of the phase component arg(X) of the timing term X takes place in the frequency domain.

15. An apparatus according to claim 13, wherein the output signal train $x_2(t+\tau)$ is shifted in time by the temporal displacement $\tau$ found to generate a shifted output signal train $x'_2(t)$.

16. An apparatus according to claim 15, wherein the shift in time is made by:

adding the term $i2\pi f\tau$ to the phase of the Fourier transform of the output signal train $X_2(f)$, and carrying out a Fourier back-transformation of the output signal train.

17. An apparatus according to claim 15, wherein an AM/AM characteristic of the n-port network is found by relating the output signal train $x_2'(t)$ that has been shifted in time by the temporal displacement $\tau$ found to the input signal train $x_1(t)$, and finding a functional relationship by regression.

18. An apparatus according to claim 15, wherein an PM/AM characteristic of the n-port network is found by relating the difference between the phase of the output signal train $x_2'(t)$ that has been shifted in time by the temporal displacement $\tau$ found and the phase of the input signal train $x_1'(t)$ to the input signal train $x_1'(t)$, and finding a functional relationship by regression.

19. An apparatus according to claim 17, wherein the regression is performed by polynomial regression.

20. An apparatus according to claim 17, wherein a predistortion AM/AM characteristic and/or a predistortion PM/AM characteristic is found by mirror-imaging the AM/AM characteristic and/or the PM/AM characteristic about the respective ideal characteristic.

* * * * *